(12) United States Patent
Mao

(10) Patent No.: US 8,228,255 B2
(45) Date of Patent: Jul. 24, 2012

(54) PRINTED CIRCUIT BOARD (PCB) ANTENNA ASSEMBLY WITH RADIO FREQUENCY (RF) SHROUD

(75) Inventor: Xiaodong Mao, Foster City, CA (US)

(73) Assignee: Sony Computer Entertainment Inc., Tokyo (JP)

( * ) Notice: Subject to any disclaimer, the term of this patent is extended or adjusted under 35 U.S.C. 154(b) by 471 days.

(21) Appl. No.: 12/348,050

(22) Filed: Jan. 2, 2009

(65) Prior Publication Data
US 2010/0171678 A1  Jul. 8, 2010

(51) Int. Cl.
*H01Q 1/52* (2006.01)
(52) U.S. Cl. ........................ 343/841; 343/872; 455/575.7
(58) Field of Classification Search ................ 343/841, 343/702, 872; 455/575.7
See application file for complete search history.

(56) References Cited

U.S. PATENT DOCUMENTS

| | | | | |
|---|---|---|---|---|
| 6,008,773 A * | 12/1999 | Matsuoka et al. | ............ | 343/818 |
| 6,215,454 B1 * | 4/2001 | Tran | ............................... | 343/841 |
| 6,218,610 B1 * | 4/2001 | Suzuki | ......................... | 174/377 |
| 7,176,836 B2 * | 2/2007 | Chen | ....................... | 343/700 MS |
| 2006/0238432 A1 * | 10/2006 | Mikami et al. | ................. | 343/795 |

* cited by examiner

*Primary Examiner* — Dieu H Duong
(74) *Attorney, Agent, or Firm* — Kilpatrick Townsend & Stockton LLP

(57) ABSTRACT

A printed circuit board (PCB) antenna assembly having a metal shroud and a method of making the same are presented. The shroud reduces radio frequency (RF) interference from the rear of the PCB antenna while not introducing unwanted nulls in front of the antenna. The metal shroud has a back panel and two angled side panels and is set so that the back panel is parallel to the PCB antenna and set at a determined distance from the PCB antenna. The shroud can be formed by applying a metallized paint to a non-conducting cover with properly oriented surfaces.

19 Claims, 9 Drawing Sheets

MINIATURE SHROUD

SMALL SHROUD

MEDIUM SHROUD

LARGE SHROUD

PRINTED CIRCUIT BOARD (PCB) ANTENNA ASSEMBLY WITH RADIO FREQUENCY (RF) SHROUD

BACKGROUND OF THE INVENTION

This application relates generally to the field of radio wave antennas, specifically printed circuit board antennas with low-cost metal shields.

A radio frequency (RF) antenna incorporated into a printed circuit board (PCB) is well known in the art. Such PCB antennas are widely applied to wireless communication devices because they are relatively inexpensive to manufacture yet effective for low power communication. The use of printed circuit boards allows precise geometries of metal to be laid for RF-sensitive traces, such as radiating or receiving elements in a transmitter, receiver or transceiver.

Many household wireless devices use a nominal frequency of 2.4 gigahertz (GHz) (2.450 GHz center frequency). This frequency corresponds to one of the unlicensed industrial, scientific and medical radio bands standardized by the International Telecommunication Union (ITU). Such devices include cordless phones, Institute of Electrical & Electronics Engineers (IEEE) 802.11x wireless computer networks (Wi-Fi), X10 cameras, Bluetooth headsets, car alarms, microwave ovens, and other equipment. Because of the unlicensed nature of this band and its popularity among device manufacturers, common households and offices are often filled with stray 2.4 GHz signals.

BRIEF SUMMARY OF THE INVENTION

Embodiments in accordance with the present disclosure relate to a specifically shaped metal shield or shroud positioned relative to a printed circuit board antenna such that the shield rejects radio frequency interference from the back side of the PCB antenna without introducing nulls to the front side. Such a shroud can be inexpensively manufactured in one embodiment by applying metallized paint to a plastic housing, a portion of which is molded to be in the shape of the shroud.

One embodiment relates to a printed circuit board antenna (PCB) assembly for receiving radio frequency (RF) signals from a first direction while reducing RF interference from a second direction, including a PCB antenna having a lateral extent and a nominal frequency and a metal shroud including a back panel positioned substantially parallel to the PCB antenna and separated a determined distance from the antenna. The metal shroud further includes first and second side panels connected at opposing ends of the back panel, the first and second side panels being angled with respect to the back panel such that opposing edges of the first and second side panels are substantially adjacent the lateral extent of the PCB antenna. The determined distance to the back panel and the angles of the first and second side panels are selected to reduce RF interference from a second direction without significantly affecting an ability of the antenna to receive RF signals from a first direction at substantially the nominal frequency.

Another embodiment relates to a method for forming a printed circuit board (PCB) antenna assembly, including providing a non-conducting housing portion for a PCB antenna, an inside rear of the housing portion having a first oblique side panel connected to a back panel connected to a second oblique side panel, applying a metallized paint to the first and second side panels and back panels, and affixing a PCB antenna having a lateral extent and a nominal frequency to the housing portion such that ends of the side panels are substantially adjacent the lateral extent of the PCB antenna.

A further understanding of the nature and the advantages of the embodiments disclosed and suggested herein may be realized by reference to the remaining portions of the specification and the attached drawings.

DETAILED DESCRIPTION OF THE INVENTION

Figure 1A:
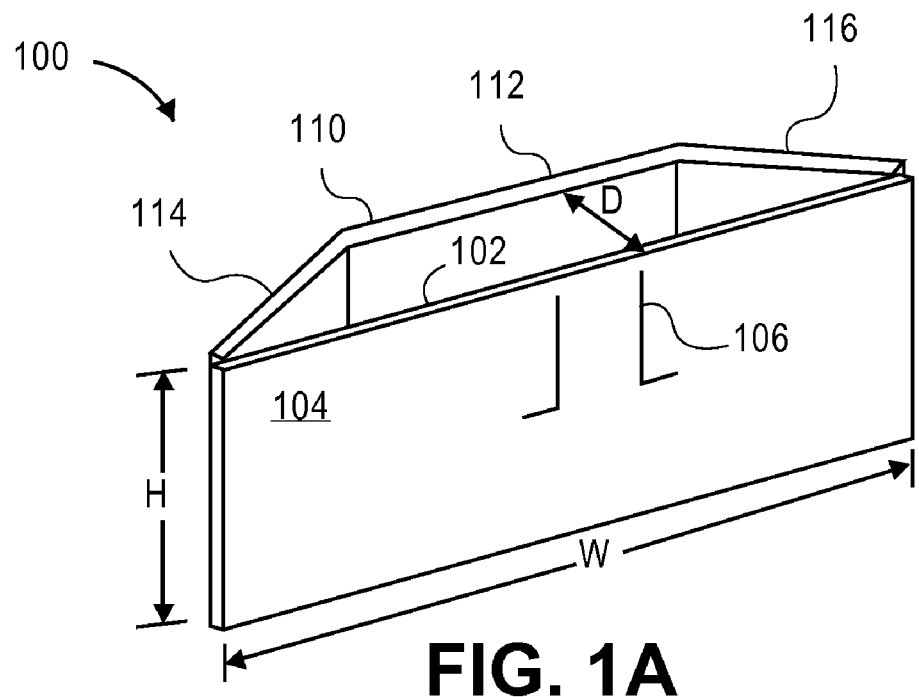
FIG. 1A illustrates a perspective view of the front, left, top of an embodiment.
Figure 1B:
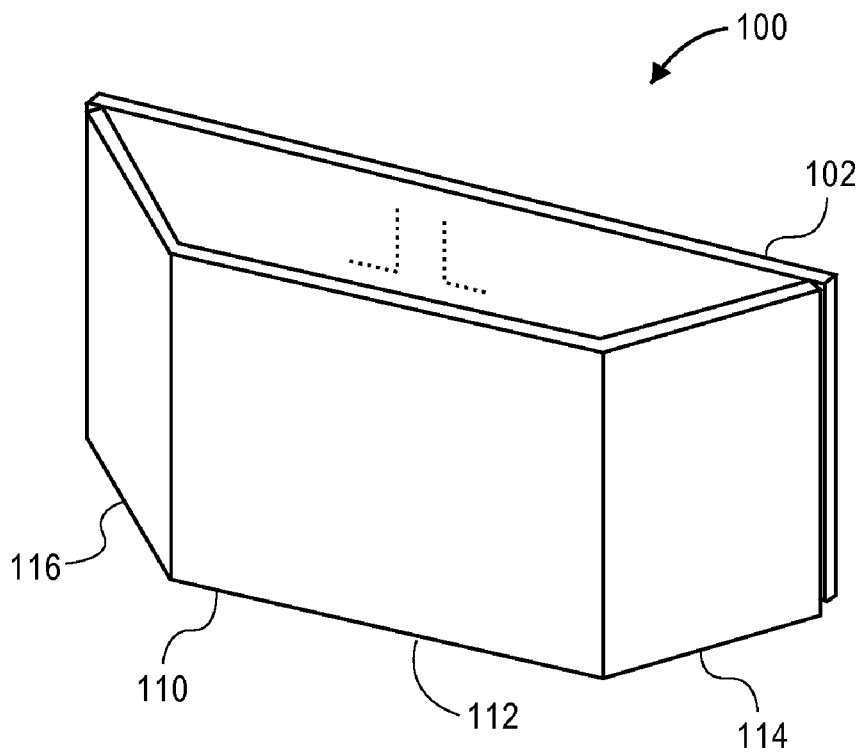
FIG. 1B illustrates a perspective view of the rear, left, top of the embodiment of FIG. 1A.

FIG. 1A illustrates a perspective view of the front, left, top of an embodiment, while FIG. 1B illustrates a perspective view of the rear, left, top of the embodiment. Printed circuit board (PCB) antenna assembly 100 includes a PCB antenna 102 having a height H and width W, in this case width W being the lateral extent.

PCB antenna 102 has a radio frequency (RF)-sensitive pattern of traces 106 set onto a nonconductive substrate 104. RF-sensitive pattern of traces 106 is tuned to radiate or receive at a nominal frequency (or set of frequencies), such as 2.4 GHz. The antenna can also be tuned to other frequencies, including those in the industrial, scientific and medical (ISM) radio bands such as 6.765-6.795 MHz, 13.553-13.567 MHz, 26.957-27.283 MHz, 40.66-40.70 MHz, 5.724-5.875 GHz, 24-24.25 GHz, 61-61.5 GHz, 122-123 GHz, and 244-246 GHz.

A portion of RF-sensitive pattern of traces 106 is laid in an L-shape, such that the antenna is sometimes referred to as an "L-antenna." Traces can also be laid in other shapes or patterns so that the conductive traces are sensitive (or insensitive) in certain directions and polarizations or to certain frequencies. Other types of PCB antennas are well known in the art, including F-antennas, snake antennas, and meander antennas.

A PCB antenna may be shaped as a rectangle, as shown in the exemplary embodiment, or it may be triangular, polygonal, circular, oval, or various other geometric shapes. Typically, PCB antennas are planar overall, even though various components may jut from either side of the antenna.

Metal shroud 110 includes back panel 112, left side panel 114 and right side panel 116. Back panel 112 is positioned substantially parallel to PCB antenna 102. "Substantially parallel" includes parallel planes within the plain meaning of the term, including those within 5°, 10°, and 30° of parallel. Back panel 112 is also positioned a determined perpendicular distance D from PCB antenna 102. Distance D is selected to minimize RF interference from the back of the antenna without introducing unwanted nulls, significantly lowering the gain, or otherwise significantly affecting the ability of PCB antenna to receive RF signals from the front at 2.4 GHz.

Figure 2A:
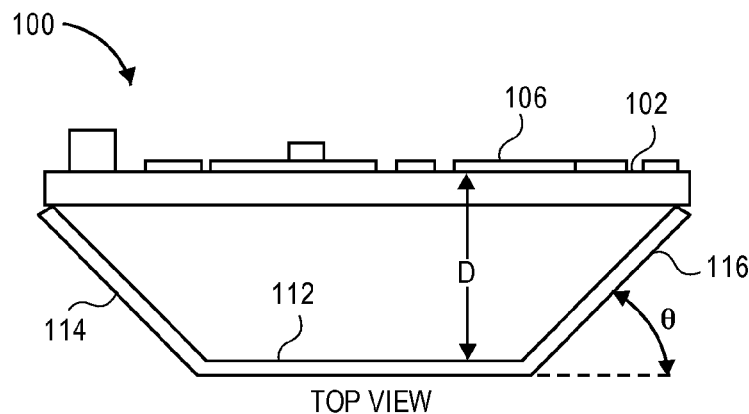
FIG. 2A illustrates the top of the embodiment in FIG. 1A.
Figure 2B:
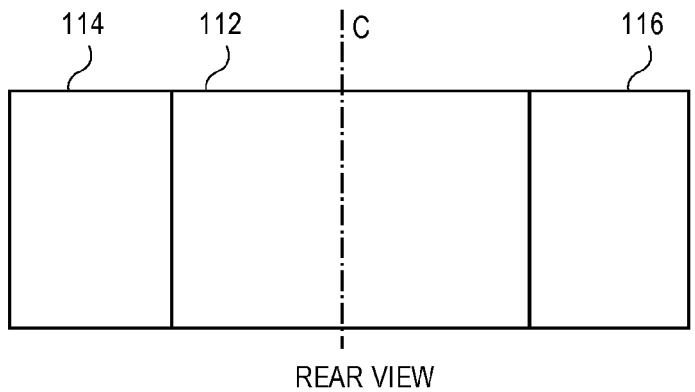
FIG. 2B illustrates the rear of the embodiment in FIG. 1A.
Figure 2C:
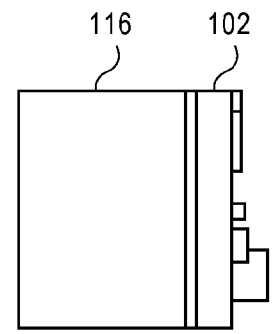
FIG. 2C is a left elevational view of the embodiment in FIG. 1A.

FIGS. 2A-2C illustrate top, rear, and left side views of PCB antenna assembly 100, respectively. Left and right side panels 114 and 116 are on opposing ends of back panel 112. Side panels 114 and 116 are symmetric with respect to PCB antenna vertical center-plane C. Non symmetric configurations are also effective. Both side panels 114 and 116 are angled with respect to back panel 112 at angle θ. Angle θ as shown for side panels 114 and 116 is approximately 45°. "Approximately" in terms of angles includes tolerances within the plain meaning of the term, including angles within ±5°, ±10°, ±15°, and greater of the nominal angle.

Perpendicular distance D between back panel 112 and front panel 102 is the distance between the front face of back panel 112 and back face of RF-sensitive pattern of traces 106. If the RF-sensitive pattern of traces extends forward or backward, such as to different layers within the PCB substrate, then distance D is the distance between the front face of the back panel and the layer of traces having a plurality of planar area. For example, if there is a main layer of antenna traces with two layers of supplemental antennas, then the perpendicular measurement shall be made between the main layer of antenna traces and the back panel.

It has been found that certain shapes of metal shrouds are more effective in reducing antenna gain (i.e., antenna sensitivity) to RF interference from the rear while maintaining antenna gain in the front. Table 1 presents empirically measured data from different shapes of metal shrouds.

TABLE 1

| | Front Peak Horiz. dBi | Front Peak Vert. dBi | Back (90° to 180°) Average dBi |
|---|---|---|---|
| No shroud (Prior Art) | −6.3 | −3.2 | −4.24 |
| Curved shroud | −3.0 | +1.4 | −8.33 |
| Straight base and 0° side panels | −3.7 | −0.1 | −7.98 |
| Straight base and 30° side panels | −3.4 | +0.9 | −8.70 |
| Straight base and 45° side panels | −2.9 | +0.9 | −9.26 |

As the data suggests, a straight metal shroud with 45° side panels is higher in horizontal polarized gain towards the front and lower in gain towards the back than other geometries of straight shrouds. Meanwhile, a curved shroud, which can be more difficult to manufacture, performs slightly poorer in horizontal gain than a straight metal shroud with 45° side panels and apparently has less shielding effect from the rear.

It has also been found that smaller sizes of metal shrouds can be more effective than larger shrouds in that the smaller shrouds shield the rear of the antenna yet do not introduce unwanted nulls to the front of the antenna. Shroud size should, however, be comparable to that of the PCB antenna, as smaller sizes generally do not perform as well. FIGS. 3A-3E present empirically measured data of PCB antenna gains at 2.40 GHz using different sizes of metal shrouds.

While an ungrounded shroud can measurably shield RF energy, a grounded shroud is more effective. Manufacturing considerations, however, may preclude a ground.

Figure 3A:
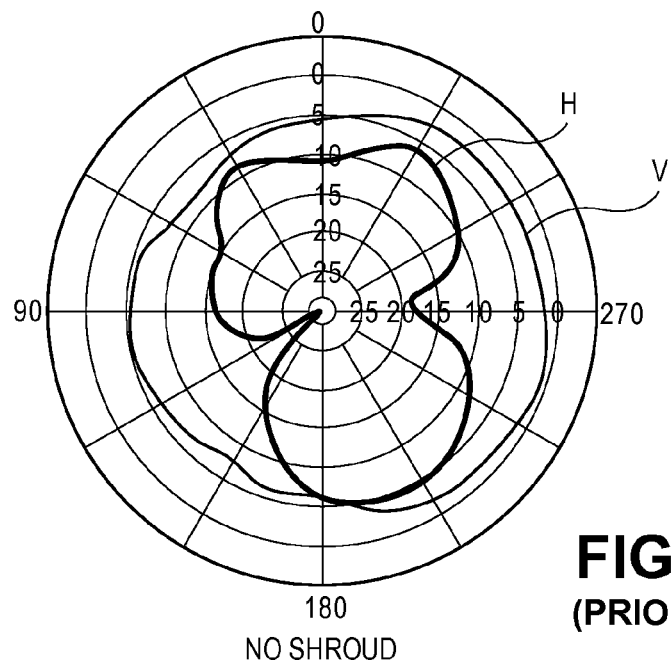
FIG. 3A illustrates antenna gain measurements of a prior art PCB antenna without a shroud.
Figure 3B:
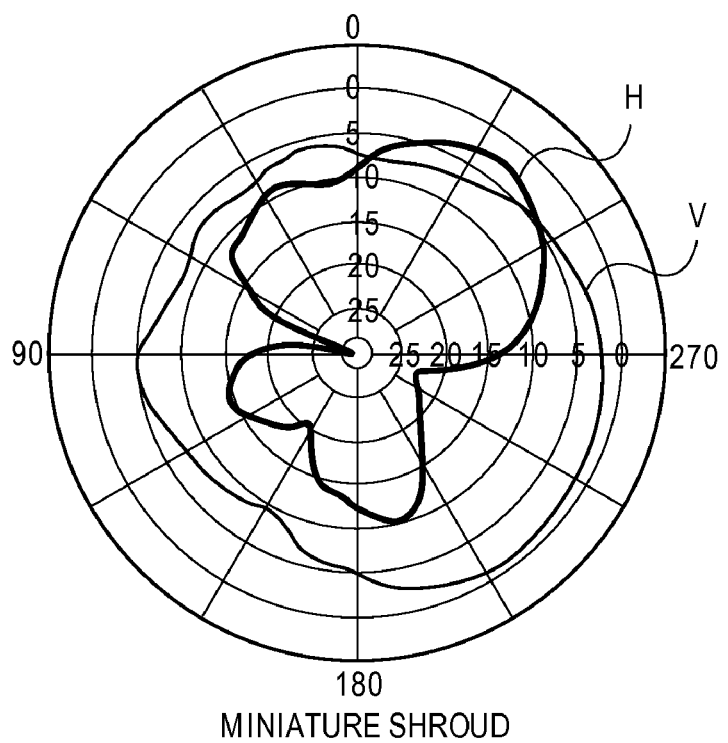
FIG. 3B illustrates antenna gain measurements of a PCB antenna with a miniature shroud in accordance with an embodiment.
Figure 3C:
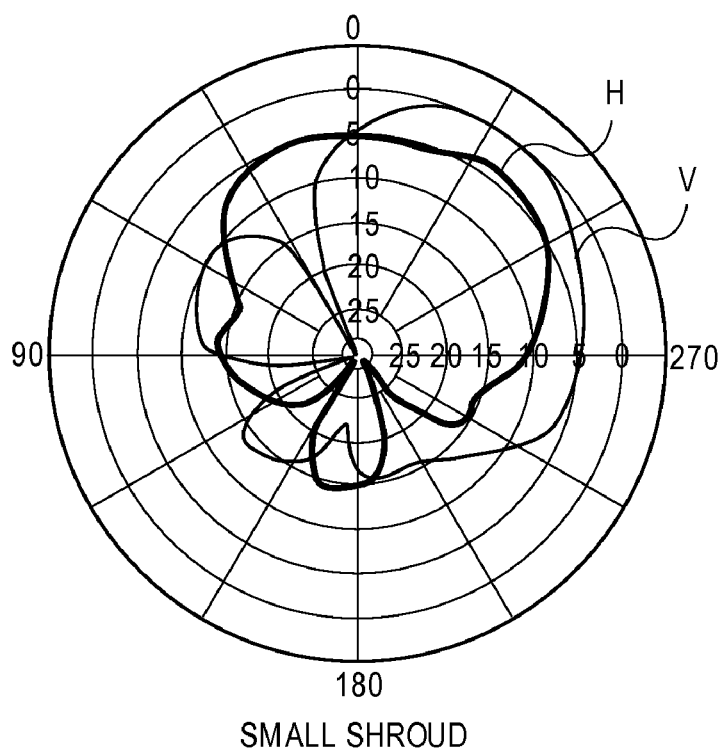
FIG. 3C illustrates antenna gain measurements of a PCB antenna with a small shroud in accordance with an embodiment.
Figure 3D:
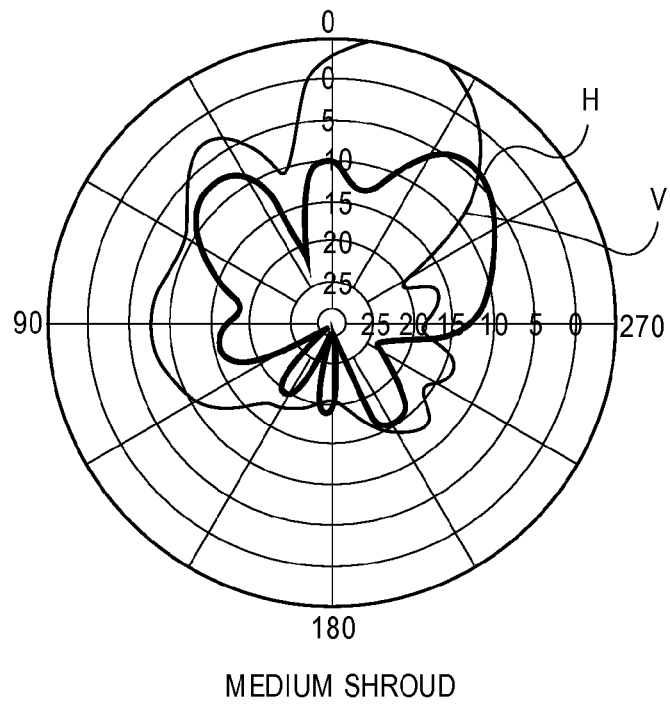
FIG. 3D illustrates antenna gain measurements of a PCB antenna with a medium shroud.
Figure 3E:
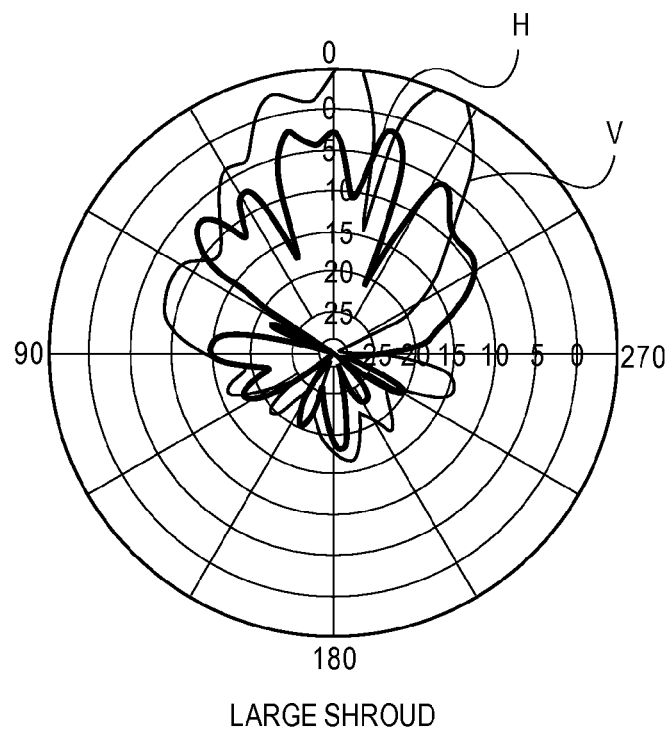
FIG. 3E illustrates antenna gain measurements of a PCB antenna with a large shroud.
Figure 4A:
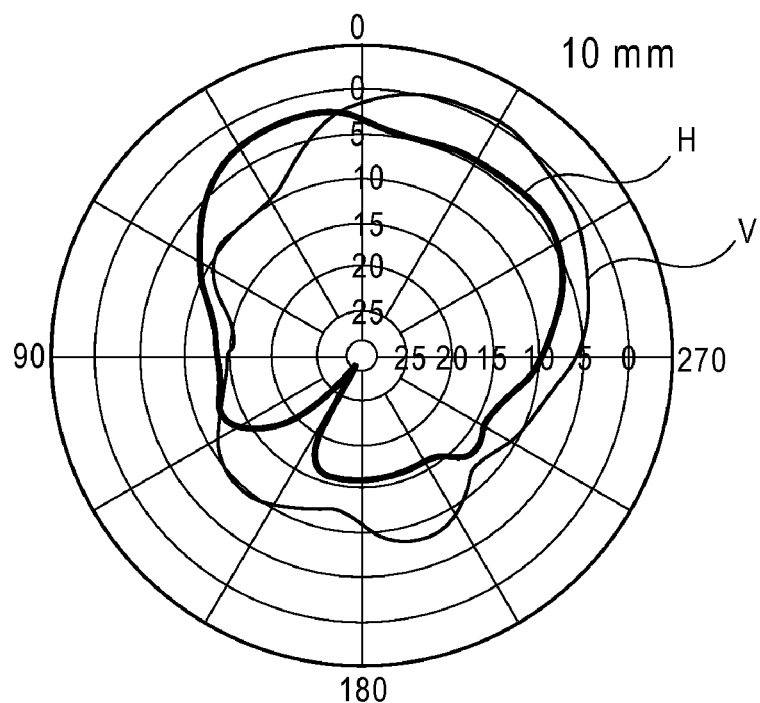
FIG. 4A illustrates antenna gain measurements of a PCB antenna with a small shroud spaced at 10 mm in accordance with an embodiment.
Figure 4B:
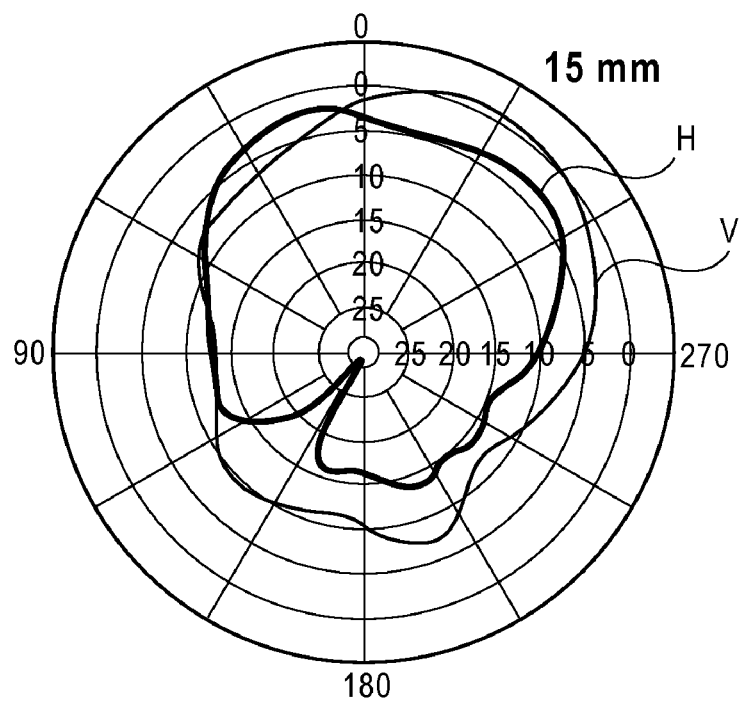
FIG. 4B illustrates antenna gain measurements of a PCB antenna with a small shroud spaced at 15 mm in accordance with an embodiment.
Figure 4C:
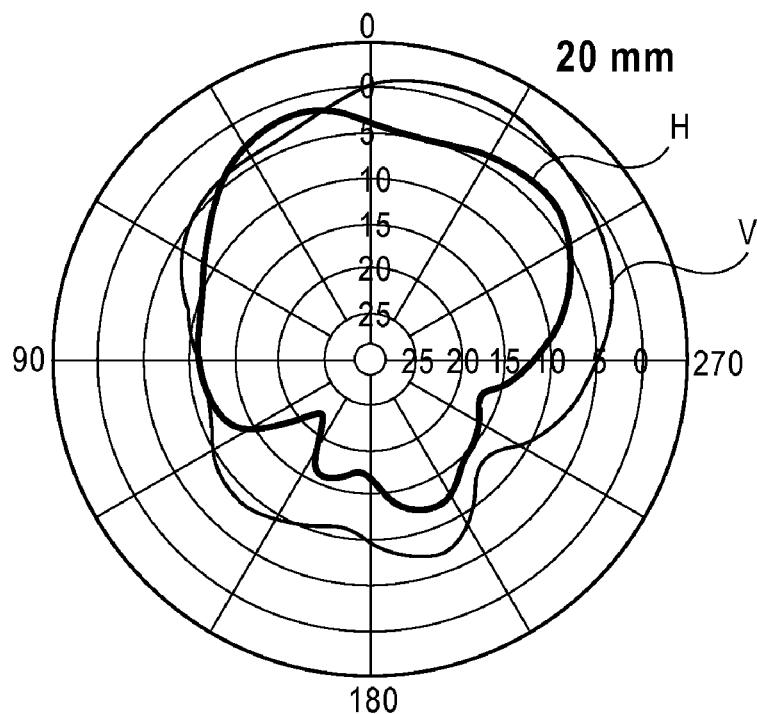
FIG. 4C illustrates antenna gain measurements of a PCB antenna with a small shroud spaced at 20 mm in accordance with an embodiment.
Figure 4D:
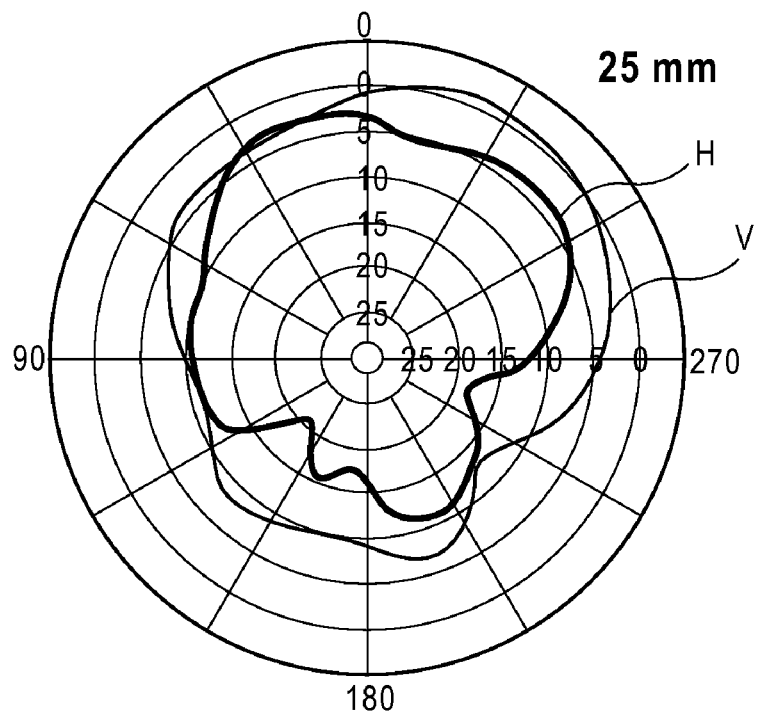
FIG. 4D illustrates antenna gain measurements of a PCB antenna with a small shroud spaced at 25 mm in accordance with an embodiment.
Figure 4E:
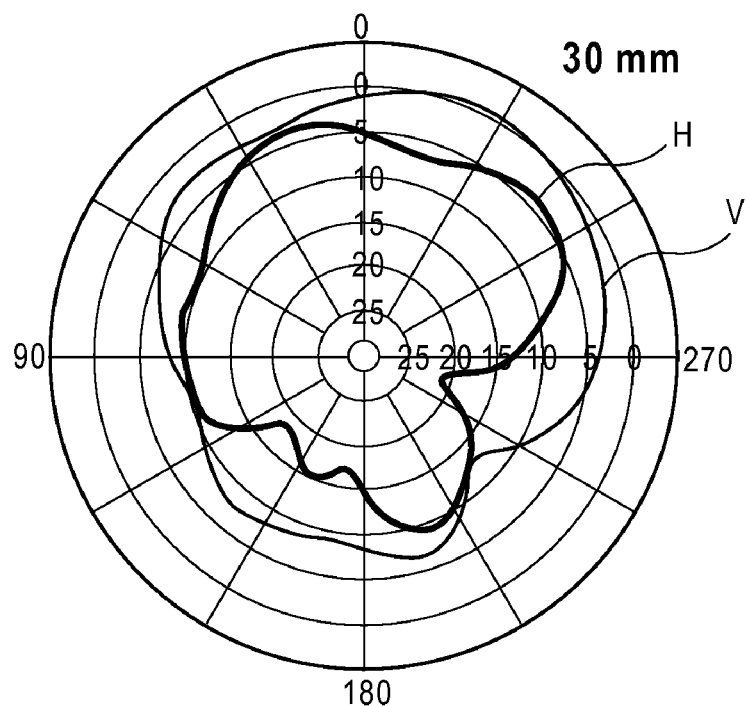
FIG. 4E illustrates antenna gain measurements of a PCB antenna with a small shroud spaced at 30 mm in accordance with an embodiment.
Figure 4F:
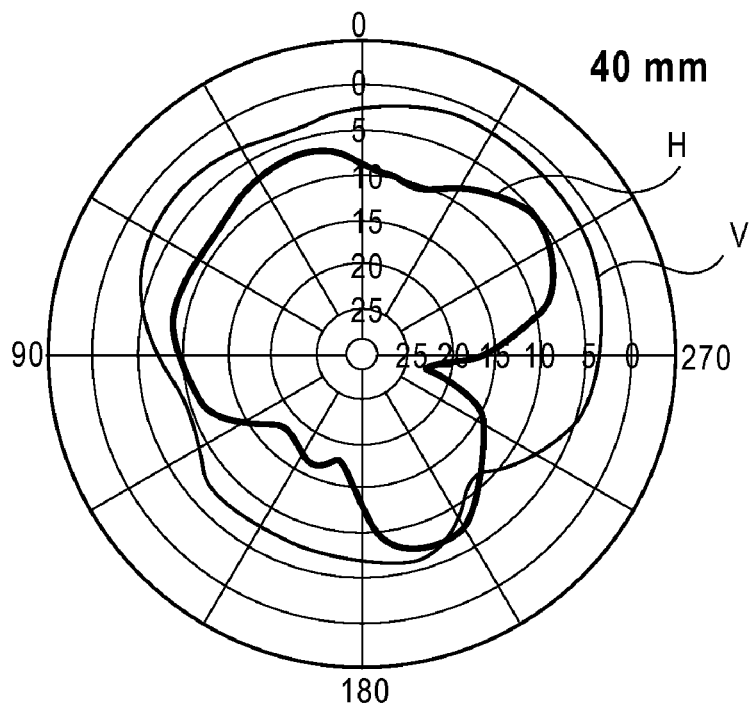
FIG. 4F illustrates antenna gain measurements of a PCB antenna with a small shroud spaced at 40 mm.
Figure 4G:
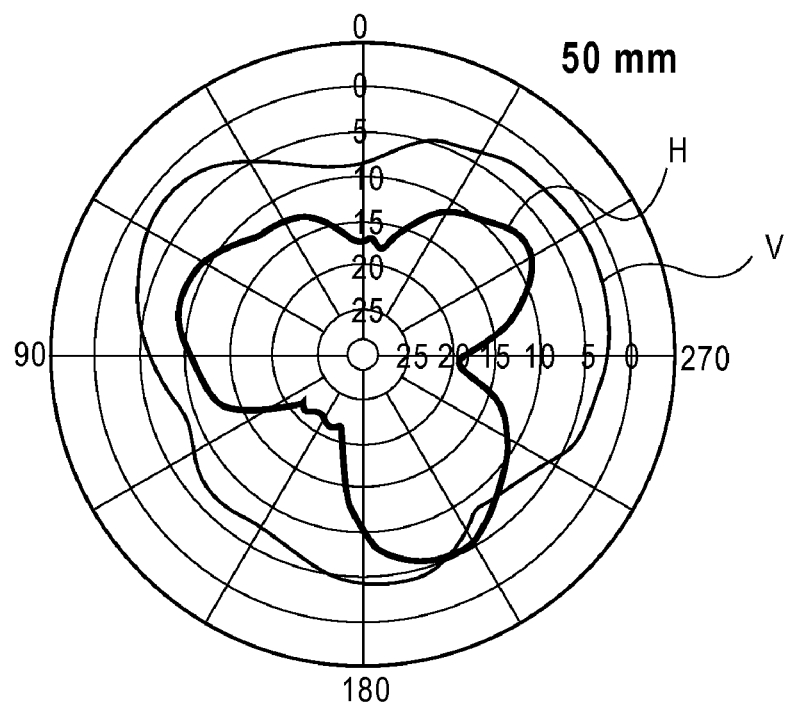
FIG. 4G illustrates antenna gain measurements of a PCB antenna with a small shroud spaced at 50 mm.
Figure 4H:
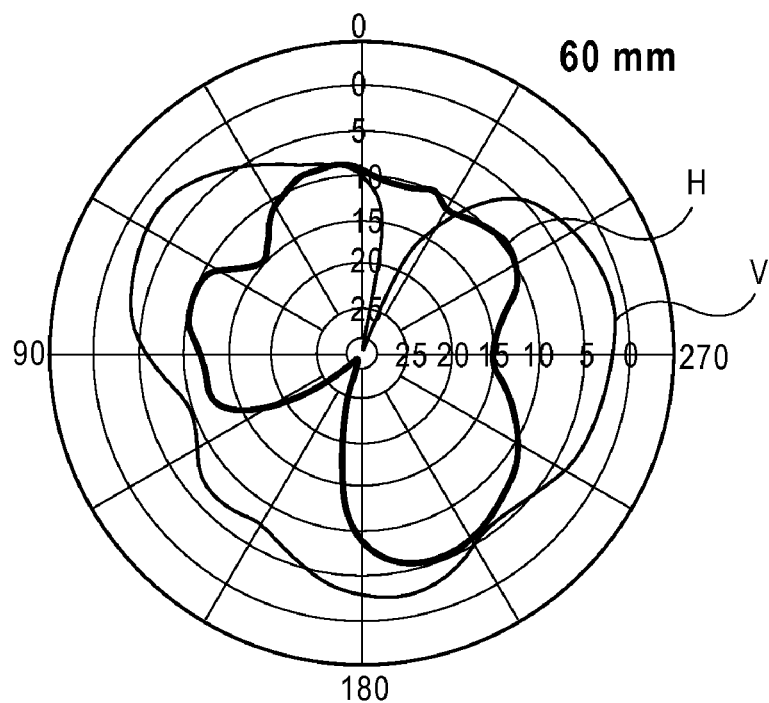
FIG. 4H illustrates antenna gain measurements of a PCB antenna with a small shroud spaced at 60 mm.

FIG. 3A illustrates antenna gain measurements of a prior art PCB antenna with no shroud. The front of the antenna is at 0° (top of figure). FIG. 3B illustrates antenna gain measurements of a PCB antenna but with a miniature shroud (140 mm W×35 mm H) placed behind the RF sensitive traces and other active elements of the PCB antenna. FIG. 3C illustrates the same but with a small shroud (140 mm W×70 mm H) such that the height of the metal shroud is substantially equal to a height of the PCB antenna. Although a null appears in the vertical RF polarity, this is not as important as the horizontal polarity which is enhanced toward the front. A null in the vertical polarity toward the front is not necessarily unwanted because this can be used to decrease interference from sources toward the front. Nulls to the rear are beneficial as the intent is to reduce antenna gain in the rear. FIGS. 3D and 3E illustrate the same measurement but with a medium shroud (300 mm W×150 mm H) and large shroud (900 mm W×300 mm H), respectively. As apparent from the figures, the medium and large shrouds introduce various unwanted nulls in the horizontal RF polarity toward the front.

FIGS. 4A-4H illustrate antenna gain measurements of a PCB antenna at 2.44 GHz. The front of the antenna is at 0° (top of each figure). For the measurements, a metal shroud with 45° side panels was placed a determined perpendicular distance away from the back of the PCB antenna. The determined distance was 10, 15, 20, 25, 30, 40, 50, and 60 mm, for which measurements are illustrated in FIGS. 4A-4H, respectively. Note that there is a large, unwanted null in front of the PCB antenna at the 50 and 60 mm spacings (see FIGS. 4G-4H). As apparent in the figures, the optimal space between the PCB antenna and exemplary shroud is between 20 and 30 mm, preferably 25 mm.

At 2.44 GHz, the wavelength of electromagnetic radiation (e.g., radio waves) is approximately 123 mm. Thus, a distance of 25 mm is approximately ⅕ of a wavelength. This has been demonstrated through experimentation to be the optimal spacing for metal shroud 110 and similar configurations.

"Approximately" in terms of distance or wavelengths includes distances or lengths within the plain meaning of the term, including those within ±5%, ±10%, ±20% or greater of the nominal value.

Figure 5A:
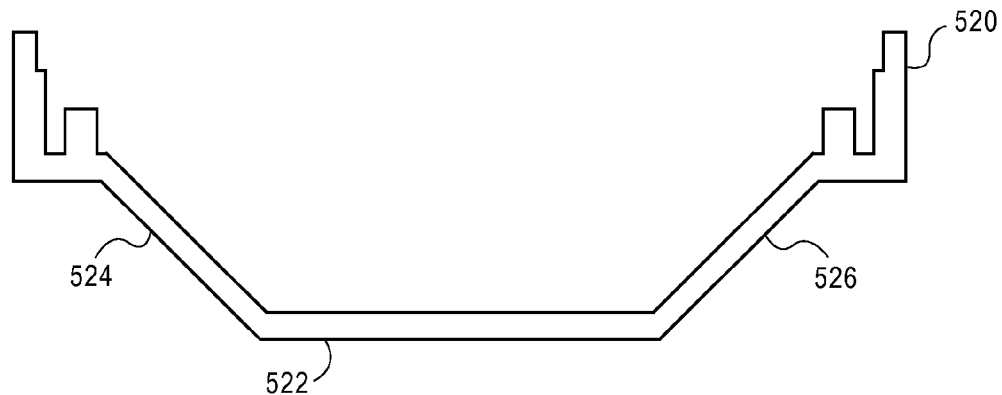
FIG. 5A illustrates a phase in a method for forming a PCB antenna assembly.

FIGS. 5A-5D illustrate a method for forming a printed circuit board (PCB) antenna assembly. In FIG. 5A, non-conducting housing portion 520 as viewed from the top has an inside rear with a back panel 522 and left and right side panels, 524 and 526, respectively. Side panels 524 and 526 are at 45° angles.

Figure 5B:
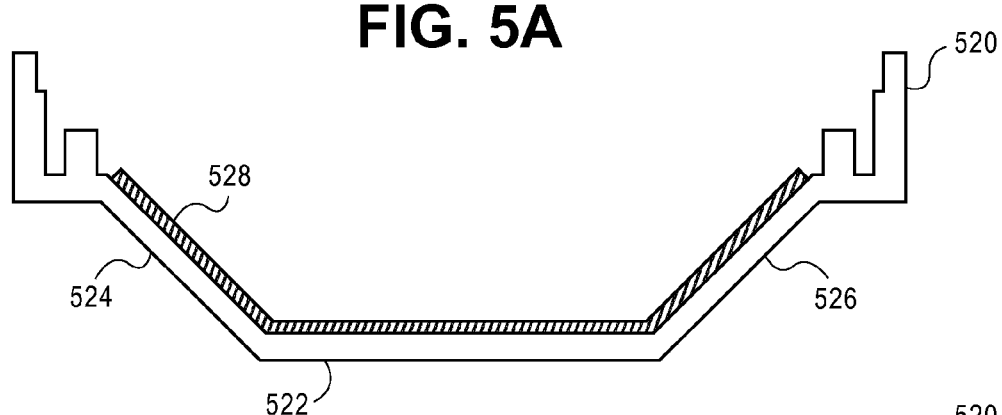
FIG. 5B illustrates a phase in a method for forming a PCB antenna assembly.

In FIG. 5B, metallized paint 528 is applied to the inside of back panel 522 and left and right side panels 524 and 526. Metallized paint 528 can be applied part way up the side panels or all the way up the side panels as shown. Metallized paint 528 could also be applied to the outside of back panel 522 and left and right side panels 524 and 526.

Metallized paint 528 can be any liquid suspension of metal particles that adheres to a surface when cured or dried. Preferred metals include aluminum, copper, and gold. Metallized paint 528 can be directly applied to the panels as shown, or it can be first applied to paper, fabric, or other suitable medium and then wrapped into or around the panels to conform them to the panel shapes. Metallized paint 528 can be deposited, brushed, sprayed, or otherwise applied to the surface.

Figure 5C:
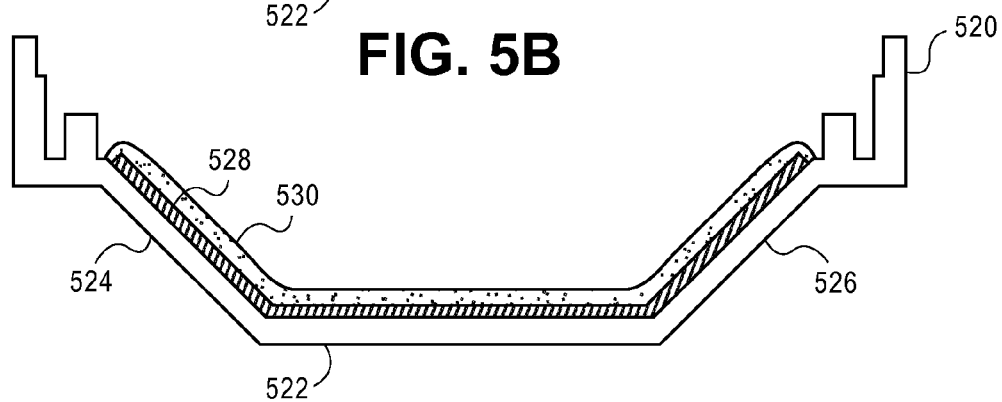
FIG. 5C illustrates a phase in a method for forming a PCB antenna assembly.

In FIG. 5C, conformal coating 530 is optionally applied over metallized paint 528. Suitable materials for conformal coating 530 include industry standard materials used to cover electronics as well as generally non-conducting coatings, such as non-metal paints.

Figure 5D:
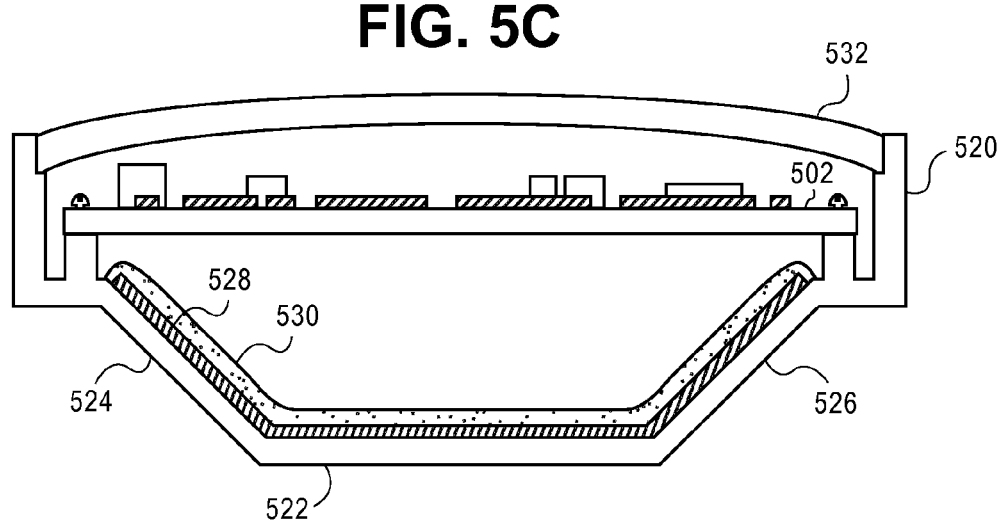
FIG. 5D illustrates a phase in a method for forming a PCB antenna assembly.

In FIG. 5D, PCB antenna 502 is fastened to housing portion 520 such that side panels 524 and 526 hold metallized paint 528 substantially adjacent to the lateral extent of PCB antenna 102. Faceplate 532, also part of the housing, is optionally attached to housing portion 520.

"Substantially adjacent" includes the plain meaning of the term, including nearby to an item but not necessarily touching the item.

Metalized paint 528 of FIG. 5D is a shroud with a back panel and angled side panels. The shroud as shown is positioned parallel to PCB antenna 520 and separated from the antenna by a determined distance. Therefore, the assembly of FIG. 5D is essentially a method of forming the assembly of FIGS. 1A-2C.

The described process results in a simple yet effective RF shield. The process can be incorporated into existing manufacturing processes for PCB antenna housings and may increase costs by only pennies per unit. RF interference from the rear is measurably reduced while the gain of the PCB antenna is enhanced in the front. The small, simple, faceted shape helps minimize the introduction of nulls to the front of the antenna.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive.

What is claimed is:

1. A printed circuit board (PCB) antenna assembly for receiving radio frequency (RF) signals from a first direction while reducing RF interference from a second direction, comprising:
    a PCB antenna having a lateral extent and a nominal frequency;
    a metal shroud comprising a back panel positioned substantially parallel to the PCB antenna and separated a determined distance from the antenna, the metal shroud further comprising first and second planar side panels connected at opposing ends of the back panel, the first and second side panels being angled at oblique angles with respect to the back panel such that opposing edges of the first and second side panels are directly connected to the lateral extent of the PCB antenna,
    wherein the determined distance to the back panel and the angles of the first and second side panels are selected to reduce RF interference from a second direction without significantly affecting an ability of the antenna to receive RF signals from a first direction at substantially the nominal frequency.

2. The assembly of claim 1 wherein the angles of the first and second side panels are approximately 45° with respect to a plane of the back panel.

3. The assembly of claim 1 wherein a perpendicular distance between the back panel and the PCB antenna is approximately ⅕ a wavelength of electromagnetic radiation at the nominal frequency.

4. The assembly of claim 3 wherein the nominal frequency is 2.44 GHz.

5. The assembly of claim 3 wherein the perpendicular distance is 25 mm.

6. The assembly of claim 1 further comprising a plastic housing, the metal shroud and the PCB antenna being secured to an interior of the housing.

7. The assembly of claim 6 wherein the metal shroud was formed by one of brushing or spraying metallized paint over plastic.

8. The assembly of claim 7 further comprising a conformal coating over the metallized paint.

9. The assembly of claim 1 wherein the metal shroud was formed by bending a flat piece of metallized paper.

10. The assembly of claim 1 wherein a height of the metal shroud is substantially equal to a height of the PCB antenna.

11. The assembly of claim 1 wherein the antenna is selected from the group consisting of an L-antenna, an F-antenna, a snake antenna, and a meander antenna.

12. The assembly of claim 1 wherein the metal shroud is grounded.

13. A method for forming a printed circuit board (PCB) antenna assembly, comprising:
    providing a non-conducting housing portion for a PCB antenna, the housing portion having a back panel positioned substantially parallel to the PCB antenna and separated a determined distance from the antenna, the housing portion further comprising first and second planar side panels connected at opposing ends of the back panel, the first and second side panels being angled at oblique angles with respect to the back panel;
    applying a metallized paint to the first and second side panels and back panel to form a continuous metal shroud;
    affixing the PCB antenna having a lateral extent and a nominal frequency to the housing portion such that ends of the side panels are directly connected to the lateral extent of the PCB antenna.

14. The method of claim 13 wherein an angle between the first side panel and a plane of the back panel is approximately 45°, and an angle between the second side panel and a plane of the back panel is approximately 45°.

15. The method of claim 13 wherein a perpendicular distance between the back panel and the PCB antenna after the applying and affixing is approximately ⅕ a wavelength of electromagnetic radiation at the nominal frequency.

16. The method of claim 13 wherein the applying includes brushing.

17. The method of claim 13 wherein the applying includes spraying.

18. The method of claim 13 further comprising applying a conformal coating over the metallized paint.

19. A printed circuit board (PCB) antenna and shroud assembly, comprising:
   a PCB antenna having a lateral extent and a nominal frequency;
   a metal shroud comprising a back panel positioned substantially parallel to the PCB antenna and separated by approximately ⅕ a wavelength of the nominal frequency from the antenna, the metal shroud further comprising first and second planar side panels connected at opposing ends of the back panel, the first and second side panels being angled at oblique angles with respect to the back panel such that opposing edges of the first and second side panels are directly connected to the lateral extent of the PCB antenna.

* * * * *